United States Patent
Seefeldt et al.

(12) 
(10) Patent No.: US 6,310,387 B1
(45) Date of Patent: *Oct. 30, 2001

(54) INTEGRATED CIRCUIT INDUCTOR WITH HIGH SELF-RESONANCE FREQUENCY

(75) Inventors: James Douglas Seefeldt, DeForest, WI (US); Christopher D. Hull, San Diego, CA (US)

(73) Assignee: Silicon Wave, Inc., San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/304,137

(22) Filed: May 3, 1999

(51) Int. Cl.[7] ................................................. H01L 29/00
(52) U.S. Cl. ............................................... 257/531
(58) Field of Search ............................................ 257/531

(56) References Cited

U.S. PATENT DOCUMENTS

| | | | |
|---|---|---|---|
| 5,070,317 | * | 12/1991 | Bhagat . |
| 5,431,987 | * | 7/1995 | Ikeda . |
| 5,539,241 | | 7/1996 | Abidi . |
| 5,694,030 | | 12/1997 | Sato et al. . |
| 5,747,870 | * | 5/1998 | Peddler . |
| 5,884,990 | | 3/1999 | Burghartz et al. . |
| 6,160,303 | | 12/2000 | Fattaruso . |

FOREIGN PATENT DOCUMENTS

| | | | |
|---|---|---|---|
| 9-132498 | 5/1997 | (JP) | ................................. H01L/27/04 |
| 98/05149 | 3/1998 | (WO) . | |

OTHER PUBLICATIONS

Muller et al, *Device Electronics for IC's*, pp 63–65, 1986.*
Ronkainen, et al., "IC Compatible Planar Inductors on Silicon", IEEE Proceedings: Circuits Devices and Systems, GB, Institution of Electrical Engineers, Stenvenage, vol. 144, No. 1, Feb. 1, 1997, pp. 29–35.

* cited by examiner

Primary Examiner—Stephen D. Meler
(74) Attorney, Agent, or Firm—Jaquez & Associates; Martin J. Jaquez, Esq.

(57) ABSTRACT

An integrated circuit inductor structure that includes a shielding pattern that induces a plurality of small eddy currents to shield the magnetic energy generated by the inductor from the substrate of the IC. The IC inductor structure is formed on a Silicon on Insulator (SOI) substrate where the substrate of the SOI has high resistivity. The shielding pattern forms a checkerboard pattern that includes a plurality of conducting regions completely isolated from each other by oxide material. The inductor has a high quality factor and a high self-resonance frequency due to the effective shielding of electromagnetic energy from the substrate of the IC while not reducing the effective inductance of the inductor.

5 Claims, 15 Drawing Sheets

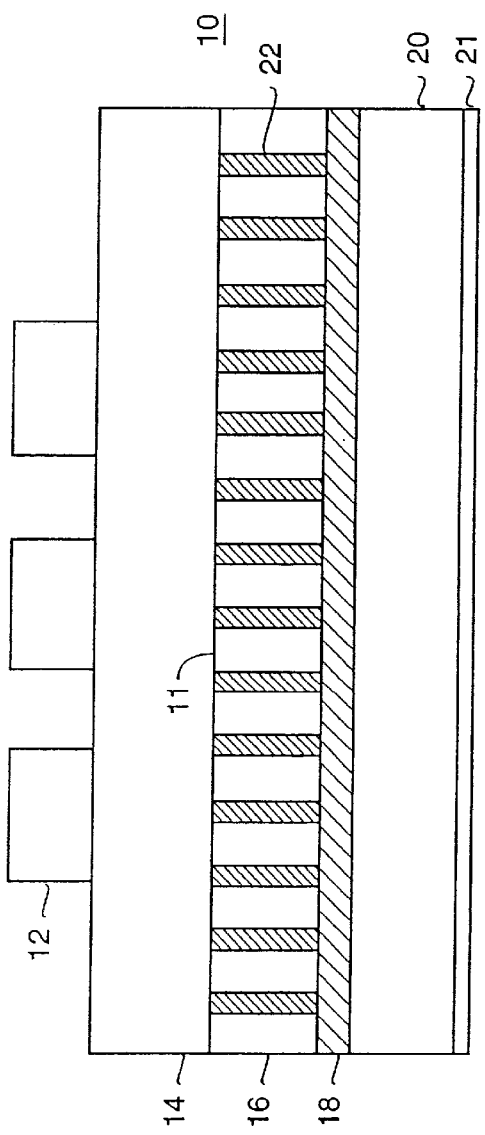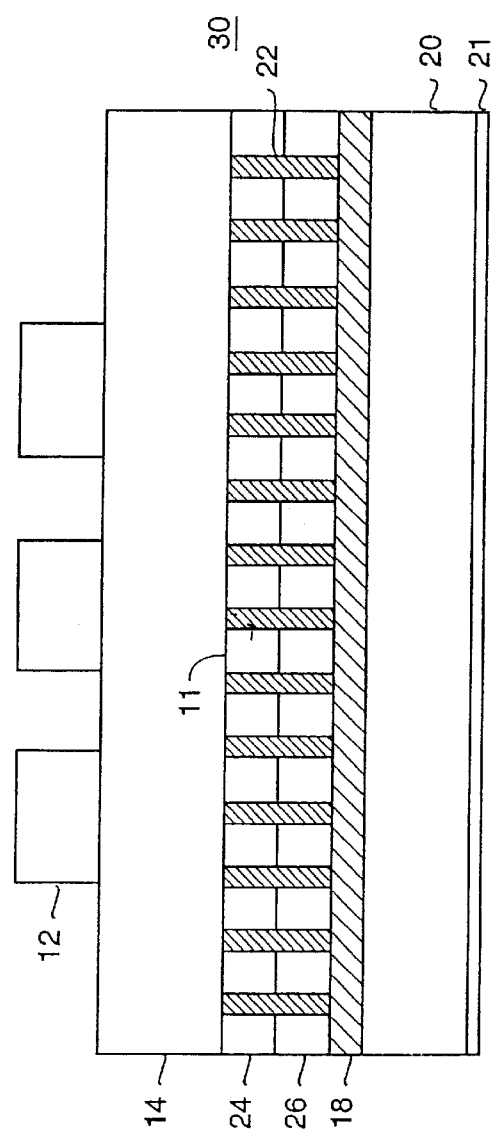

INTEGRATED CIRCUIT INDUCTOR WITH HIGH SELF-RESONANCE FREQUENCY

BACKGROUND OF THE INVENTION

1. Field of the Invention

This invention relates to integrated circuit inductors and more particularly to integrated circuit inductors having a high self-resonance frequency and a high quality factor, $Q_n$.

2. Description of Related Art

It is desirable to include inductors on integrated circuits ("IC") versus off the IC to reduce the form factor and cost of devices requiring inductors. IC inductors, however, commonly have unacceptably low quality factors, low self-resonance, and cause interference with surrounding or neighboring IC components. This is particularly true for IC inductors used in high frequency applications such as in the front end of radio frequency ("RF") receivers and transmitters.

Due to the significant advantages of having IC inductors, several solutions have been investigated. First, inductors having different geometric patterns such as those shown in FIGS. 1A to 1C have been analyzed including a spiral inductor 42, a simple loop inductor 44, and a meander inductor 46. Of these inductors, investigation has revealed that spiral inductors are most easily adapted for inclusion in silicon ICs because a desired inductance can be achieved using a smaller surface area with a spiral inductor versus a loop or a meander inductor.

As way of background FIG. 2A shows such an inductor 50 which generates magnetic field lines 52 due to the flow of current shown in the FIGURE. FIG. 2B illustrates a cross sectional view of an IC structure 54 including the inductor 50. The IC 54 includes a silicon substrate 56, a conductive ground plane 58, and a silicon oxide layer 60. When the inductor 50 is included on an IC such as shown in FIG. 2B and current flows through the inductor 50 such as shown in FIG. 2A, the lines of magnetic field can enter the substrate 56 and be significantly reduced. This reduces the quality factor ($Q_n$) of the inductor. In addition the frequency at which the inductor 50 self-resonances is also reduced due to parasitic capacitance between the inductor 50 and the substrate 56.

In order to limit the passage of the magnetic fields of an inductor into the IC's substrate, insulating regions and ground plates have been inserted between the inductor and substrate. For example, U.S. Pat. No. 5,539,241 to Abidi et al. teaches etching a pit under the inductor to create an insulating region between the inductor and the substrate. As noted in the PCT application number US98/05149 to Yue et al. (which is discussed below), the inclusion of this insulating region may effect the mechanical integrity of the IC, in particular, the inductor. In addition, the construction of an IC with such insulating region is likely to be expensive and complex.

Yue et al. also discusses another IC inductor structure where the structure includes a solid metal conducting ground shield 72 such as shown in FIG. 3A. As shown in FIG. 3B, the solid conducting ground shield 72 is placed between the inductor 50 and the substrate 56. As shown in FIG. 3A, an image current 76 is induced from the magnetic field lines generated by the inductor 50. This induced image current 76 generates magnetic field lines 74 where the flux of the magnetic field is opposite the flux of the magnetic field of the inductor 50. Consequently, while this IC inductor configuration isolates the inductor 50 from the substrate 56 (no magnetic coupling), the configuration substantially reduces the effective inductance of the inductor and thereby the $Q_n$ of the inductor. In order to overcome these problems, Yue et al. suggests an IC inductor configuration that includes a patterned ground shield 80 between the inductor 50 and substrate 56 as shown in FIGS. 4A and 4B. The patterned ground is a polysilicon ground shield that includes locally isolated conductive lines 84 separated by slots 85 where the conductive lines 84 are orthogonal to the conductive line segments of the inductor 50. Yue et al. teaches that the orthogonal relationship between the conductive lines 84 and conductive line segments reduces or eliminates the generation of an image current in the ground shield 80. The ground shield effectively terminates any electric field generated by the inductor 50 thus limiting any leakage into the substrate 56. The termination of the electric field at the ground shield 80, however, may effectively generate a quasi capacitor where the inductor acts as one plate and the ground shield acts as another plate. The relative proximity of the inductor to the ground shield increases its effective capacitance. Consequently, the IC inductor configuration of Yue et al. may not have an acceptable quality factor at high frequencies.

It is also noted that Yue et al. suggests that the substrate 56 is a low resistivity substrate. In particular, Yue et al. includes examples of an 11 ohm-cm silicon substrate and a 19 ohm-cm silicon substrate. It has been found that low resistivity substrates employed in IC inductor configurations may also lower the self-resonance frequency of the inductor regardless of the ground shield or grounding technique employed. Thus, a need exists for an IC inductor configuration that has a high self-resonance frequency and an acceptable quality factor at high frequencies.

SUMMARY OF THE INVENTION

The present invention is an integrated circuit inductor structure that includes a shielding pattern that induces a plurality of small eddy currents to shield magnetic energy generated by the inductor from the substrate of the IC. The IC inductor structure is formed on a Silicon on Insulator (SOI) substrate where the substrate of the SOI has high resistivity. The shielding pattern forms a checkerboard pattern that includes a plurality of conducting regions completely isolated from each other by a dielectric or nonconducting material. The inductor has a high quality factor and a high self-resonance frequency due to the effective shielding of electromagnetic energy from the substrate of the IC while not reducing the effective inductance of the inductor or introducing substantial parasitic capacitance.

In other embodiment, the IC inductor structure includes an inductor formed over a second dielectric layer. The second dielectric layer is formed over a first dielectric layer and the first dielectric layer is formed over a substrate. The substrate ideally has high resistivity. In particular, the resistivity is about 1 kohm-cm. The first dielectric layer is formed from silicon oxide and the second dielectric layer is formed from at least one oxide layer. In another embodiment, a plurality of conducting regions are inserted into the second dielectric layer wherein the plurality of conducting regions induce small eddy currents that do not significantly reduce the inductance of the inductor.

BRIEF DESCRIPTION OF THE DRAWINGS

FIG. 7 is a cross section AA' of the spiral inductor over the patterned shield as shown in FIG. 6 where the cross section details a first embodiment of an IC inductor structure according to the present invention.

FIG. 8 is a cross section AA' of the spiral inductor over the patterned shield as shown in FIG. 6 where the cross section details a second embodiment of an IC inductor structure according to the present invention.

Like reference numbers and designations in the various drawings indicate like elements.

DETAILED DESCRIPTION OF THE INVENTION

Figure 1A:
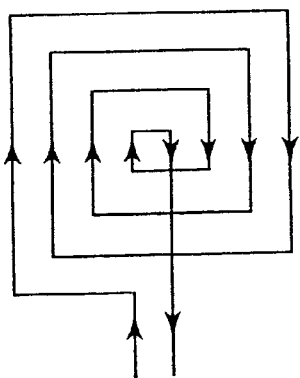
FIG. 1A is a diagram of an exemplary prior art spiral ductor.
Figure 1B:
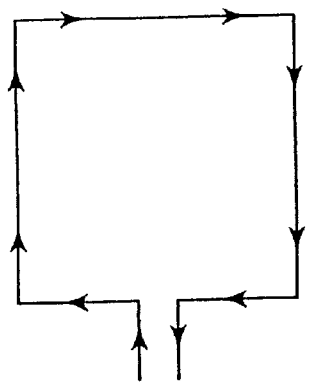
FIG. 1B is a diagram of an exemplary prior art loop inductor.
Figure 1C:
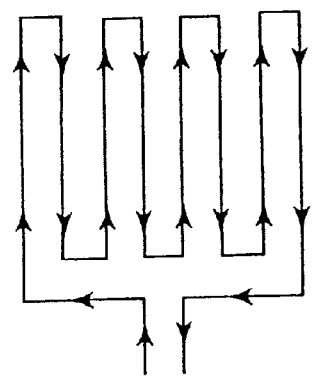
FIG. 1C is a diagram of an exemplary prior art meander inductor.
Figure 2A:
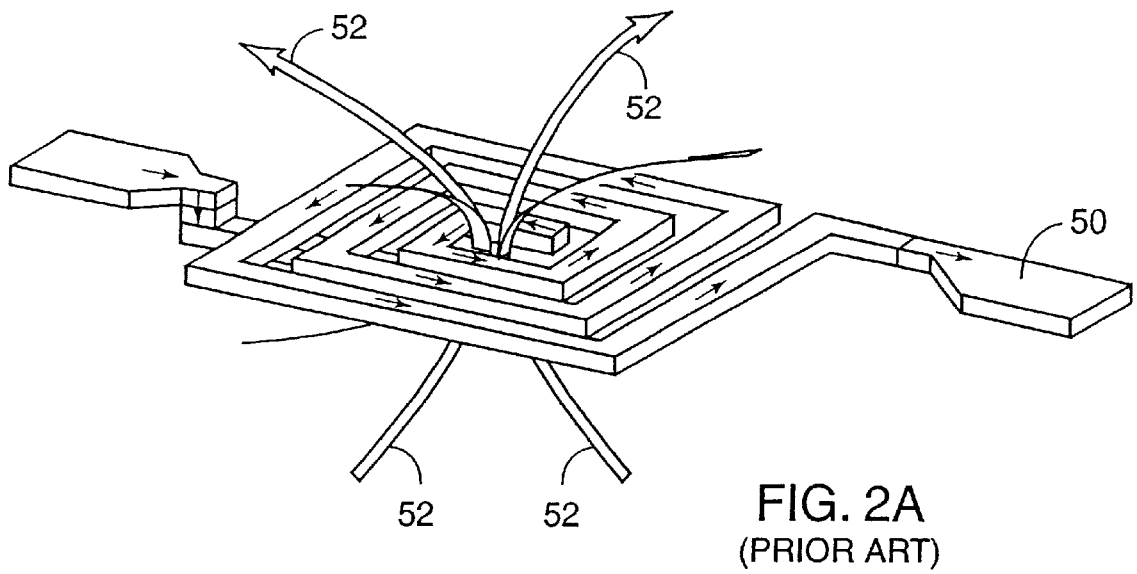
FIG. 2A is a perspective view of a prior art spiral inductor and lines of magnetic fields generated by the same when current circulates through the inductor.
Figure 2B:
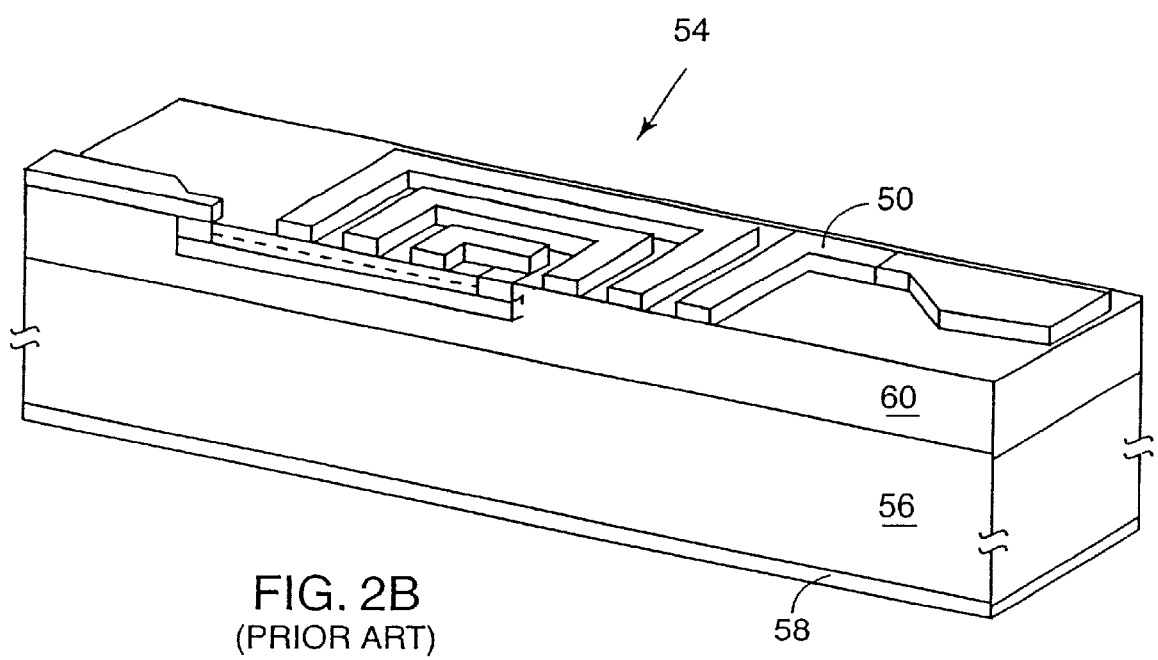
FIG. 2B is a cross sectional view of a prior art IC inductor structure where the inductor is a spiral inductor and the structure has no grounding shields or shielding patterns.
Figure 3A:
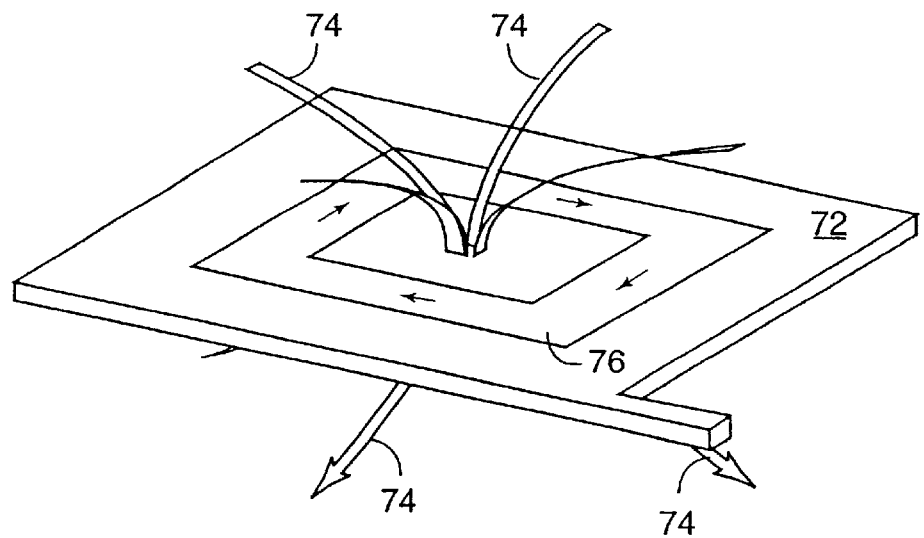
FIG. 3A is a perspective view of a prior art solid metal ground shield and lines of magnetic fields generated by the same when current circulates through the shield.
Figure 3B:
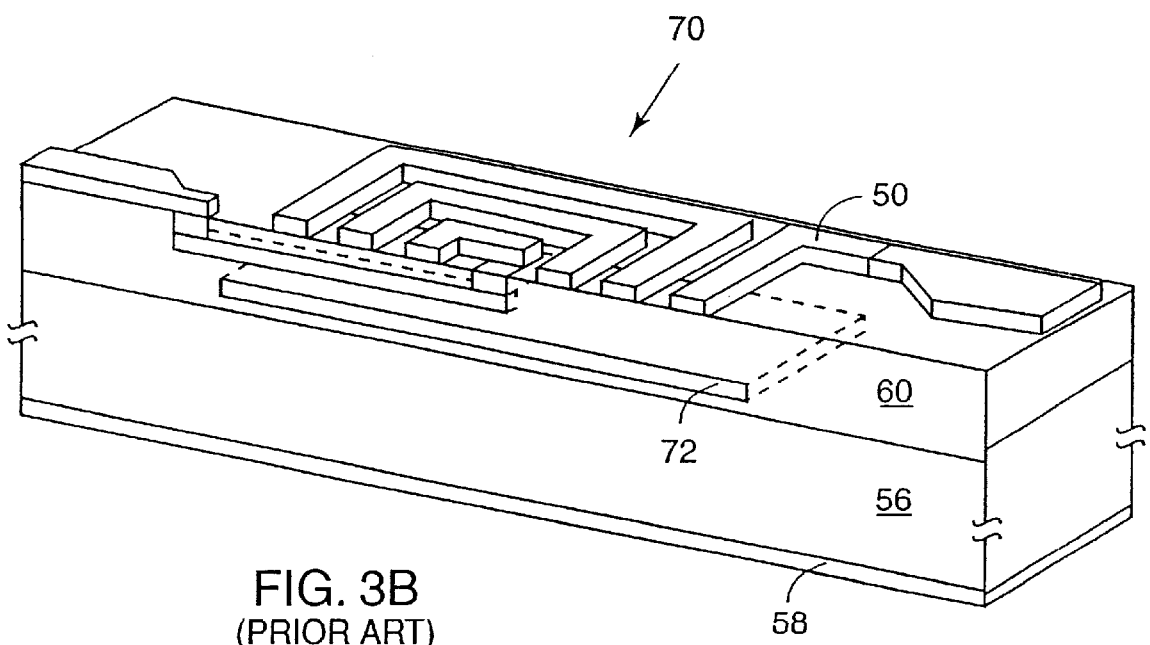
FIG. 3B is a cross sectional view of a prior art IC inductor structure where the inductor is a spiral inductor and the structure has includes the solid metal ground shield shown in FIG. 3A.
Figure 4A:
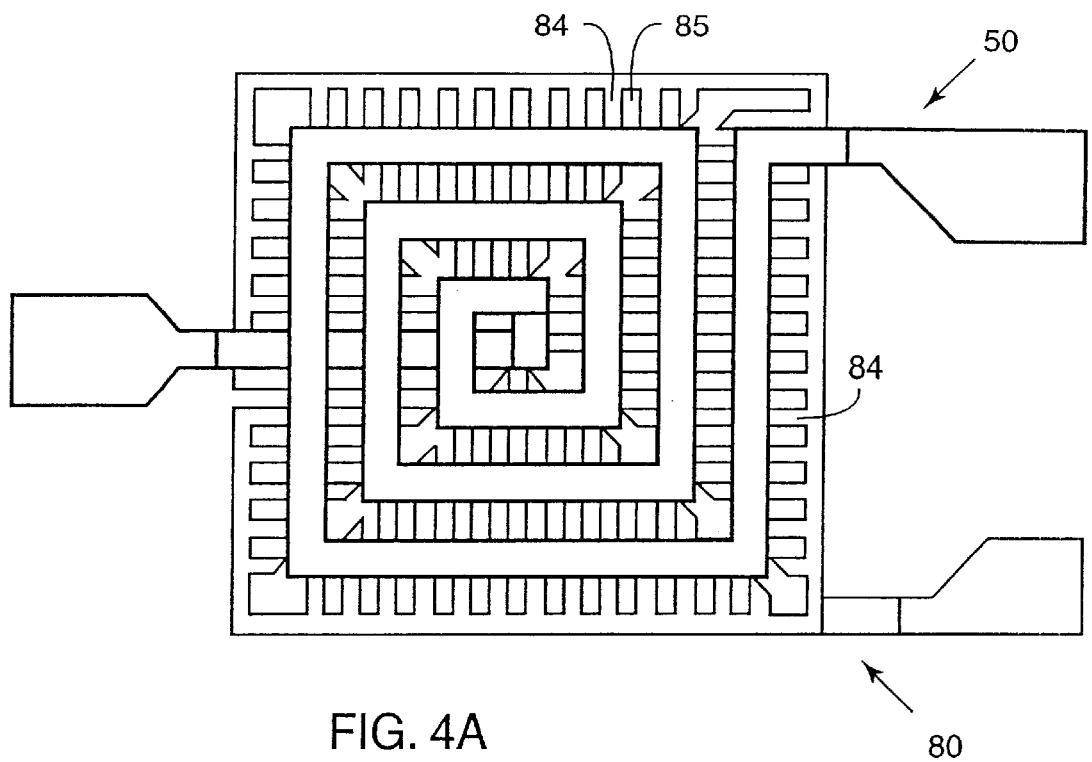
FIG. 4A is a top view of a prior art spiral inductor over a patterned ground shield.
Figure 4B:
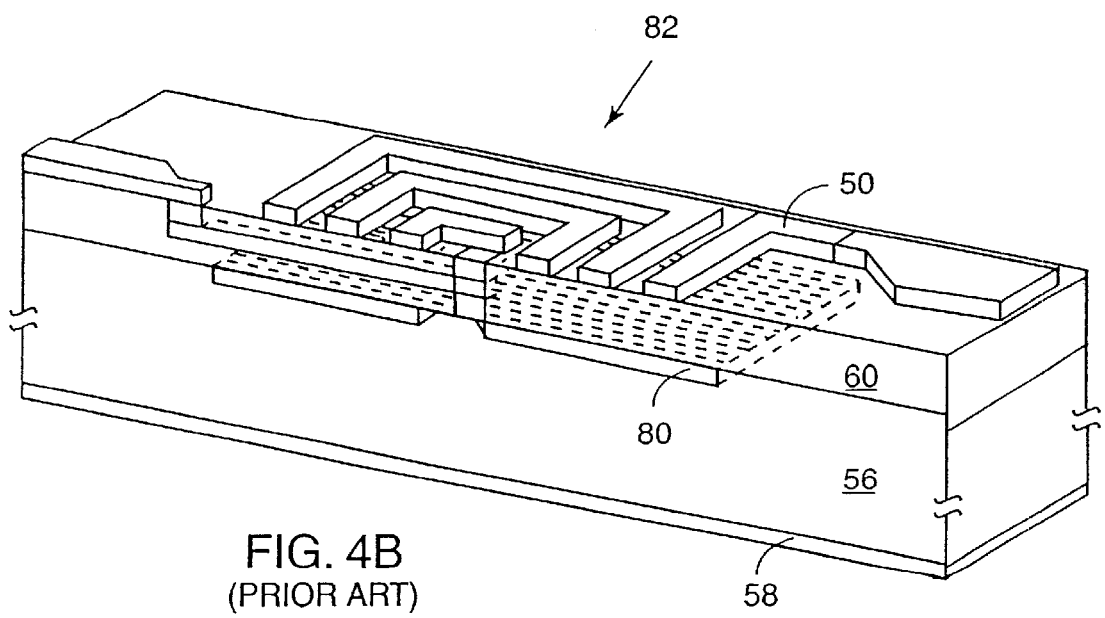
FIG. 4B is a cross sectional view of a prior art IC inductor structure including the spiral inductor and patterned ground shield shown in FIG. 4A.
Figure 5:
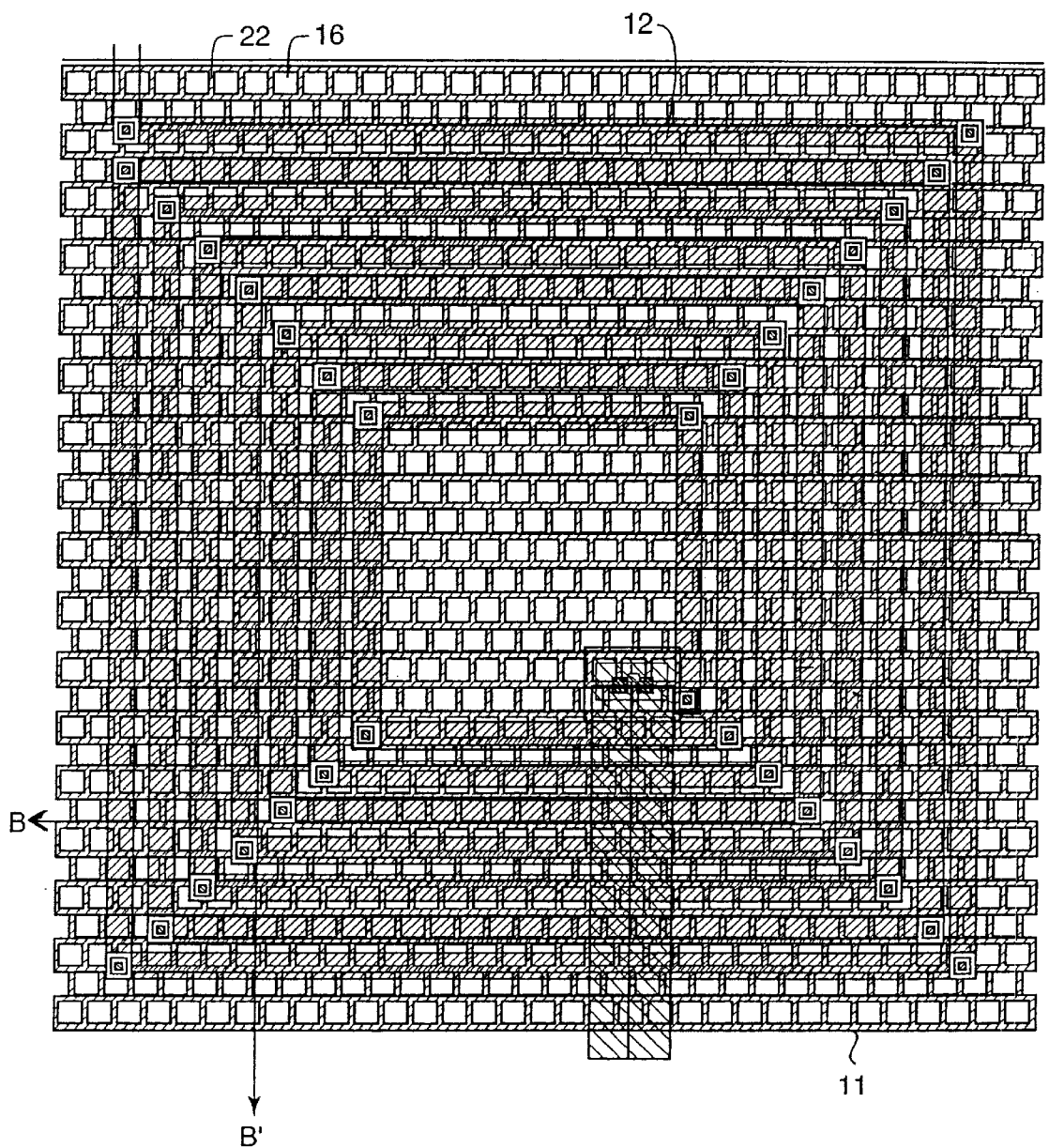
FIG. 5 is a top view of a spiral inductor over a patterned shield in accordance with the present invention where the patterned shield forms a checkerboard pattern of isolated conducting regions.
Figure 6:
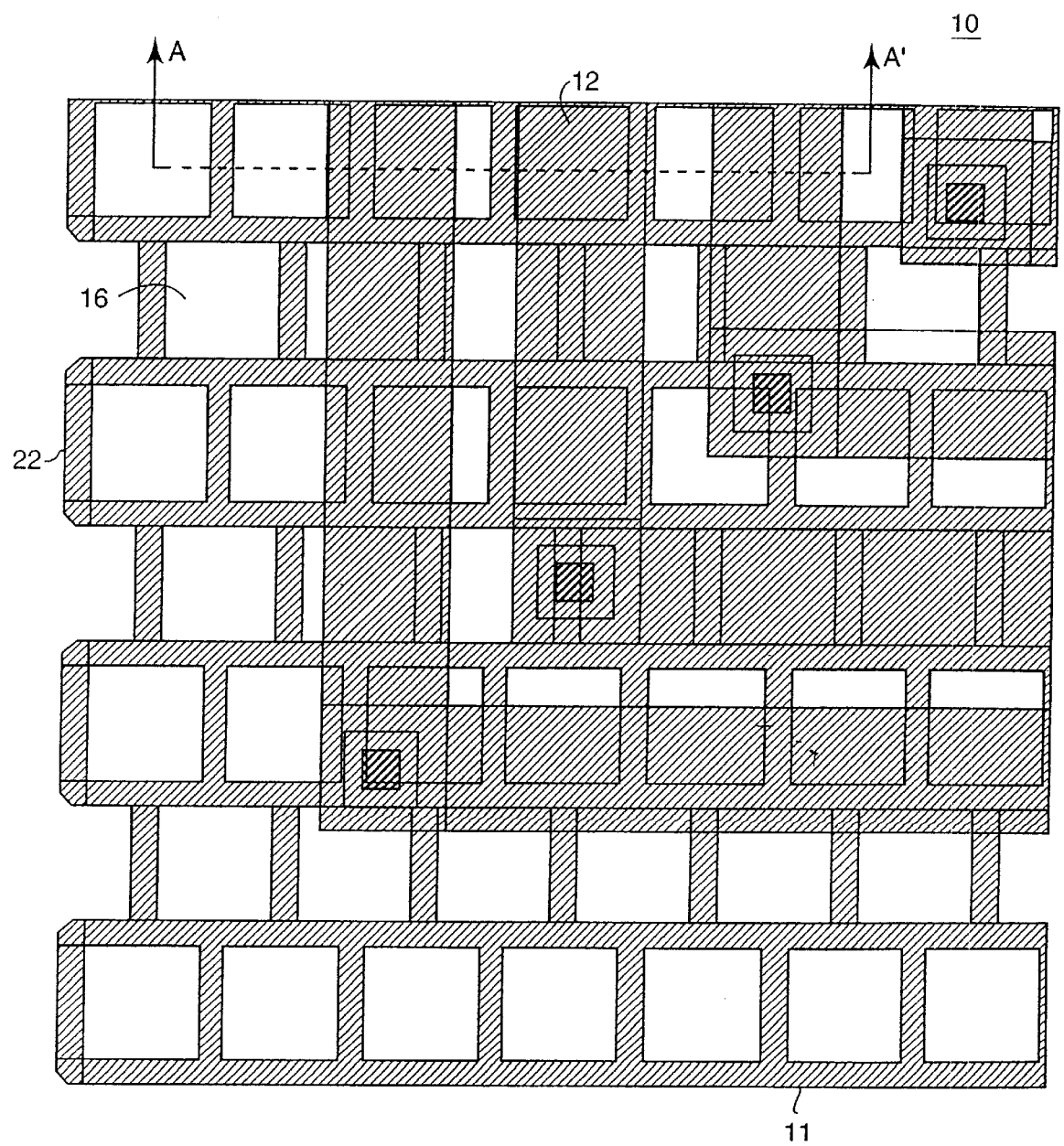
FIG. 6 is a diagram of a section BB' of the spiral inductor over a patterned shield as shown in FIG. 5.
Figure 9A:
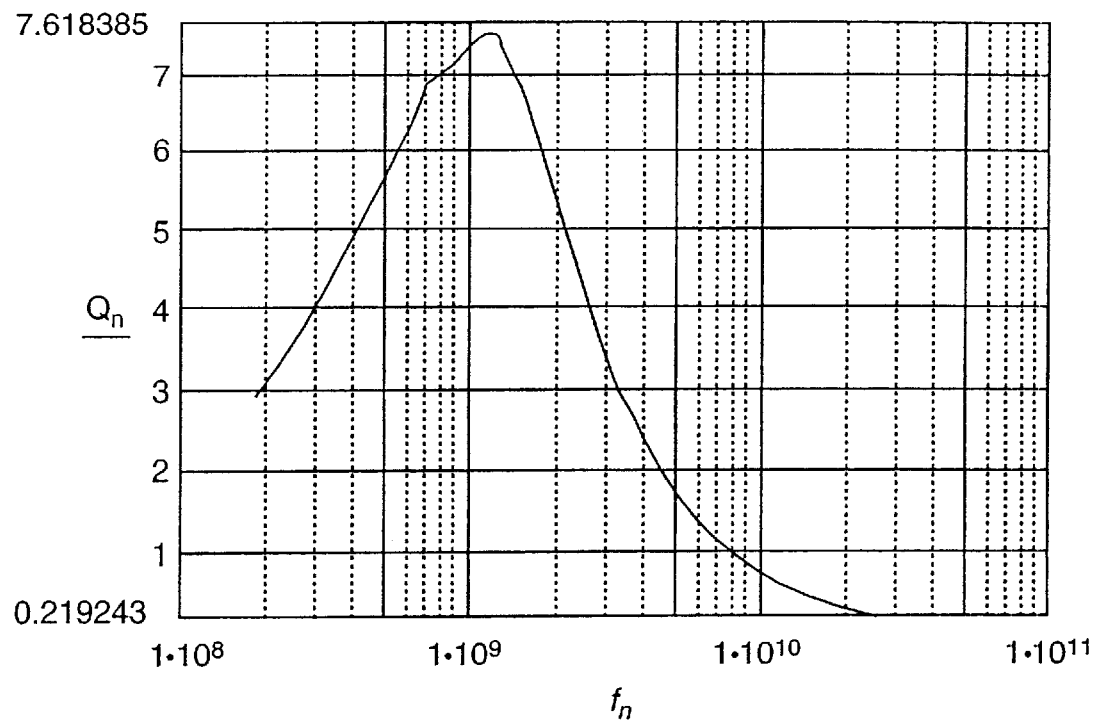
FIGS. 9A to 9D are graphs detailing the ratio of inductor quality, $Q_n$ versus operating frequency, $f_n$ for different IC inductor structures.
Figure 9B:
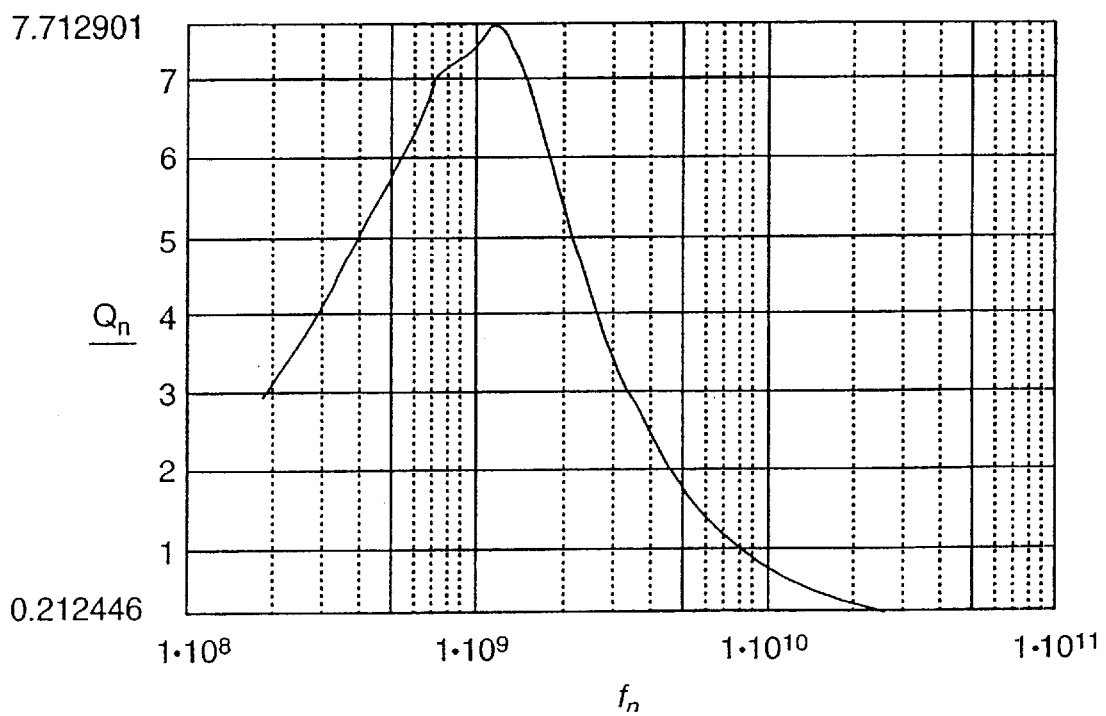
Figure 9C:
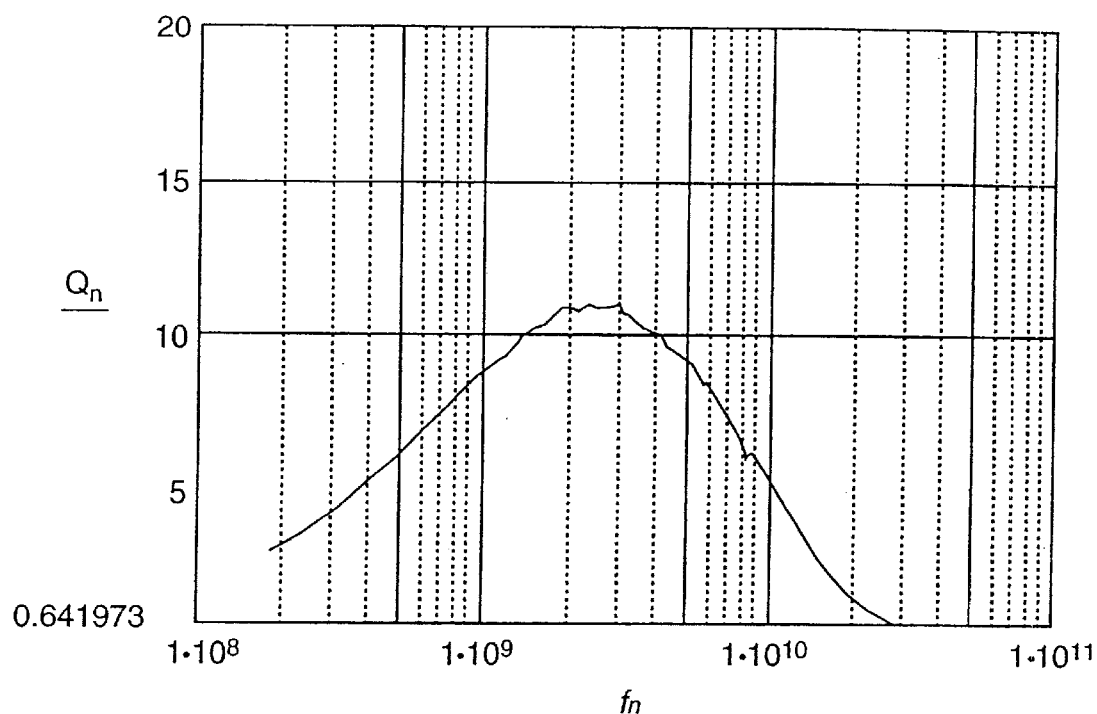
Figure 9D:
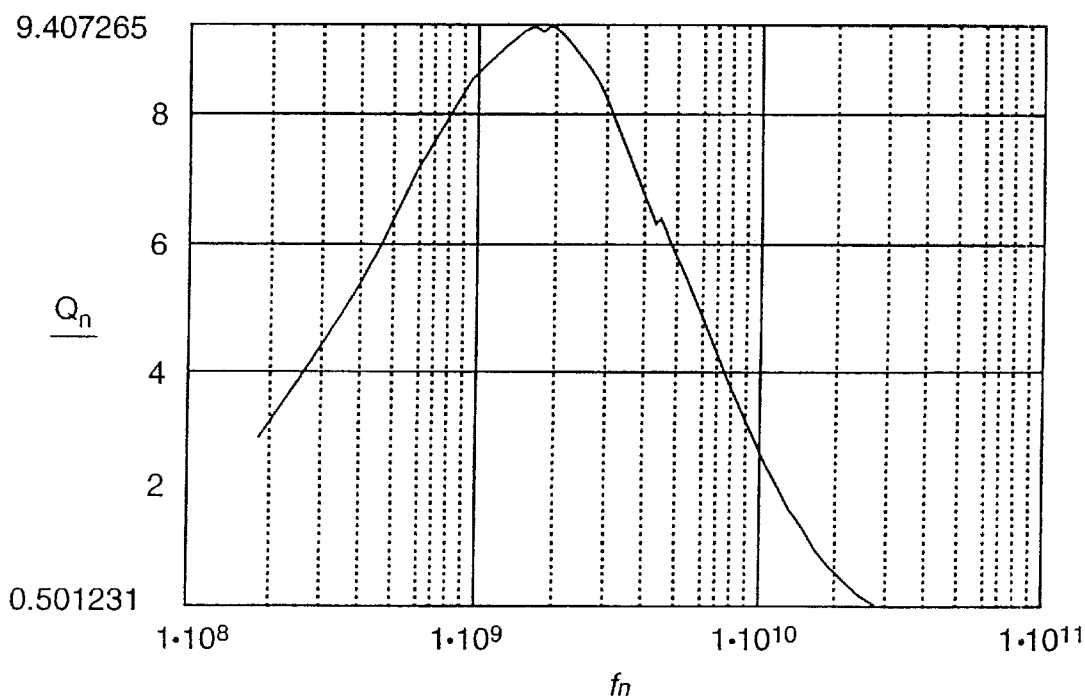

Throughout this description, the preferred embodiment and examples shown should be considered as exemplars, rather than as limitations on the present invention. As noted above, an ideal IC inductor configuration has a high quality factor at high frequencies and a high self-resonance frequency. An exemplary IC inductor configuration 10 according to the present invention is presented with reference to FIGS. 5 to 7. FIG. 5 is a top-level view of an exemplary IC inductor configuration 10 according to the present invention. The IC 10 includes an inductor 12 over a checkerboard pattern 11 that includes a plurality of conducting regions 16 isolated at four sides by isolating lines 22. FIG. 6 is a diagram of section BB' of the IC 10 shown in FIG. 5. FIG. 6 more clearly illustrates the conductive regions 16 that are electrically isolated from each other by isolating lines 22. The combination of conductive regions 16 and isolating lines 22 form a checkerboard pattern 11 of electrically isolated conducting regions 16.

In use, the inductor 12 generates magnetic field lines that enter each of the conducting regions 16. The magnetic field lines induce small eddy currents in each of the conducting regions 16 since the regions are not grounded as in the Yue et al. configuration described above. Due to the small size of the conducting regions and their isolation from other conducting regions 16 (the isolation is shown in more detail in FIGS. 7 and 8), a magnetic field having a flux opposite of the flux of the magnetic field generated by the inductor 12 is not induced. Consequently, the inductance of the inductor 12 is not reduced. FIG. 7 is diagram of an exemplary side section AA of IC 10 shown in FIG. 6.

The exemplary side section of IC 10 includes a high resistivity substrate 20, silicon oxide layer 18, shield region 11 comprised of epitaxial silicon 16 and an oxide 22, an oxide layer 14 and an inductor pattern 12. In this preferred embodiment, the inductor 12 is formed on a Silicon On Isolator ("SOI") pattern. It is noted that ideally the substrate 20 has a resistivity of about 1 kohm-cm. As shown in this FIGURE, each conducting region 16 is comprised of epitaxial silicon which is separated from neighboring regions by U-trenches 22 filled with a non-conductive oxide. Between the inductor 12 and the conducting regions is an oxide layer 14. The oxide layer 14 may be comprised of one or more different oxide layers. The SOI is ideally formed over a conducting Printed Circuit Board ("PCB") 21.

Accordingly, when a current flows in inductor 12, small eddy currents are generated in each epitaxial region 16. As noted, these regions 16 are not grounded. Consequently, an electric field signal is generated that is electrically grounded at the PCB 21 level. This creates a small effective capacitor where the inductor 12 acts as the first plate and the PCB 21 acts as the second plate. Due to the distance between the inductor 12 and PCB 21, the effective capacitance of such a capacitor is small. Accordingly, the IC inductor configuration 10 according to the present invention has a high quality factor and a high self-resonance frequency (as shown in FIGS. 9A to 9D, which are presented below). FIG. 8 is a cross sectional diagram of another exemplary IC inductor configuration 30 according to the present invention. In this configuration 30, each conducting region of the checkerboard pattern includes a n-type collector ("CN") region 24 and n-type buried layer ("NBL") region 26. These regions have a lower resistance than an undoped epitaxial silicon. Consequently, the IC inductor configuration 30 may have a higher quality factor.

FIGS. 9A to 9D illustrate the quality factor, $Q_n$ versus operating frequency, $f_n$ for different IC inductor configurations. The inductor configurations modeled in FIGS. 9A and 9B have low resistivity substrates 20 while the inductor configurations modeled in FIGS. 9C and 9D have high resistivity substrates 20 as in the preferred embodiments. In addition, the inductor configurations modeled in FIGS. 9B and 9C include the checkerboard isolation regions as shown in FIGS. 5 to 8, while the inductor configurations modeled in FIGS. 9A and 9D do not include the checkerboard isolation regions. As can be seen by review of these figures, the IC inductor configuration that includes a high resistivity substrate with checkerboard isolation region has the highest quality factor and also the highest self-resonance (the high point of the quality factor occurs at the highest operating frequency). These FIGURES also indicate that the inclusion of a high resistivity substrate greatly increases the quality factor and self-resonance frequency of the IC inductor.

Figure 10:
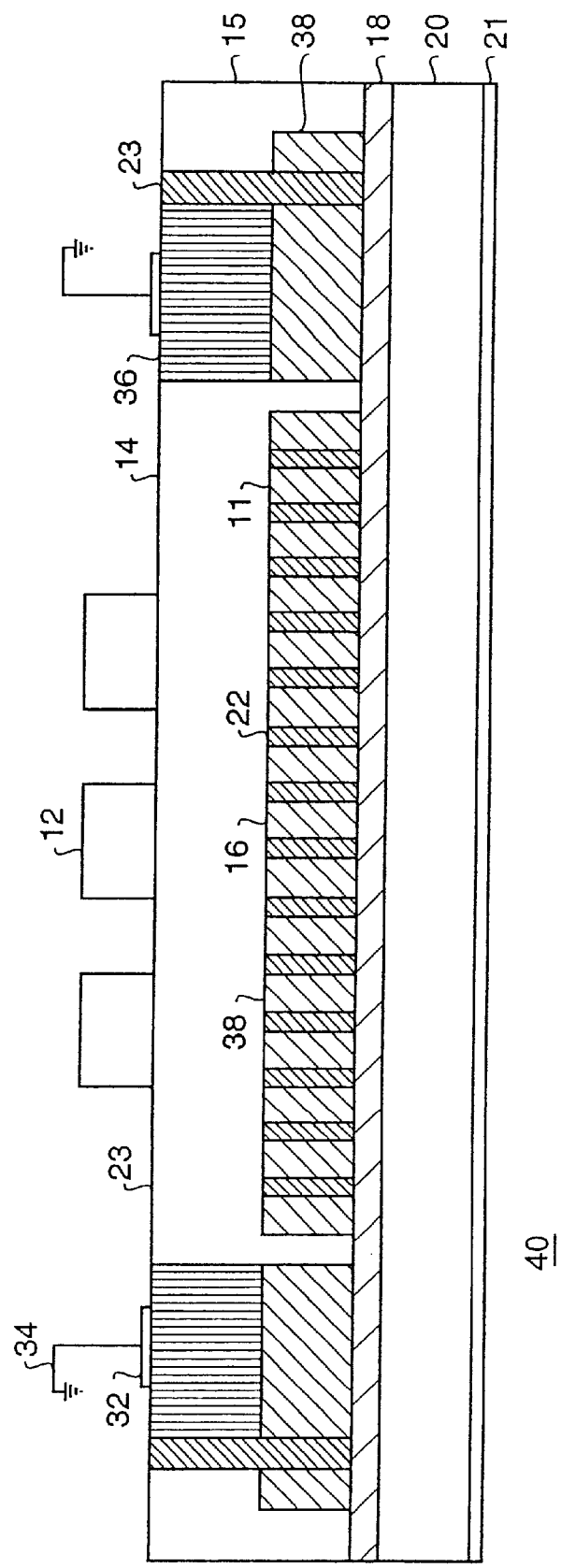
FIG. 10 is a cross sectional view of the first embodiment of an IC inductor structure according to the present invention shown in FIG. 7 further surrounded by a guard ring structure to electrically isolate the IC inductor from neighboring IC components.

It is also noted that the isolation technique according to the present invention also helps to isolate the inductor 12 from neighboring IC components. In high frequency applications, higher isolation techniques may be required. FIG. 10 is a cross sectional diagram of an exemplary structure that isolates an inductor 12 according to the present invention. In this FIGURE, the IC inductor configuration 10 is isolated by a guard ring configuration that is described in detail in the co-pending and commonly assigned application entitled "Trench Isolated Guard Ring Region for Providing RF Isolation" filed Feb. 23, 1999 and assigned application Ser. No. 09/255,747. This application is hereby incorporated by reference for its teachings on guard ring region isolation techniques.

As shown in FIG. 10, the IC inductor 10 is inserted in a mesa formed by a guard ring including by U-trenches 23 immediately surrounding the inductor configuration 10. Each U- trench 23 has adjacent CN 36 and NBL 38 conductive regions coupled by a metal contact 32 to a ground 34. The conductive regions are also surrounded by U-trenches. As described in the co-pending and incorporated application, the guard ring isolation configuration further isolates the IC inductor configuration 10 from neighboring IC components.

As noted above, the IC inductor configuration 10 according to the present invention ideally uses Silicon-On-Insulator (SOI) as its base. As shown in FIGS. 5 to 8, and 10, an insulating layer 18 separates circuit devices 12 from the solid silicon substrate 20. The advantages of SOI BICMOS process technology include greater signal isolation, higher speed devices with lower power consumption, and dense digital CMOS logic. The circuitry of the present invention is preferably implemented in an SOI BiCMOS process technology that uses bonded wafers ("bonded SOI"). Bonded SOI processes are well known to those of ordinary skill in the art and are believed to be currently available. Examplary SOI BiCMOS process technologies that may be used to implement the inventive inductor structure are described in U.S. Pat. No. 5,661,329 entitled "Semiconductor Integrated Circuit Device Including An Improved Separating Groove Arrangement", U.S. Pat. No. 5,773,340 entitled "Method of Manufacturing a BIMIS", and U.S. Pat. No. 5,430,317 entitled "Semiconductor Device", the complete disclosures of which are all hereby fully incorporated into the present application by reference.

Figure 11:
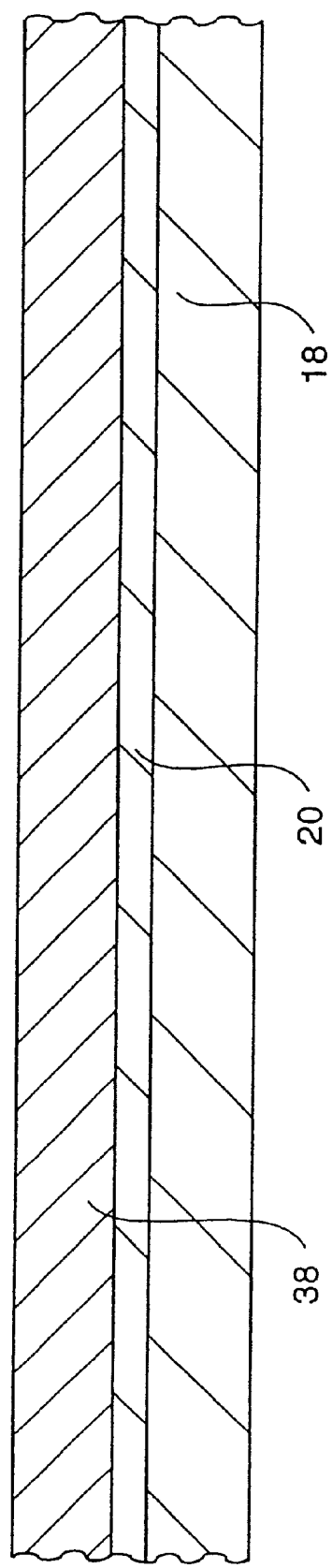
FIGS. 11 to 15 are sectional views of an exemplary method of producing or manufacturing the IC structure shown in FIG. 10.
Figure 12:
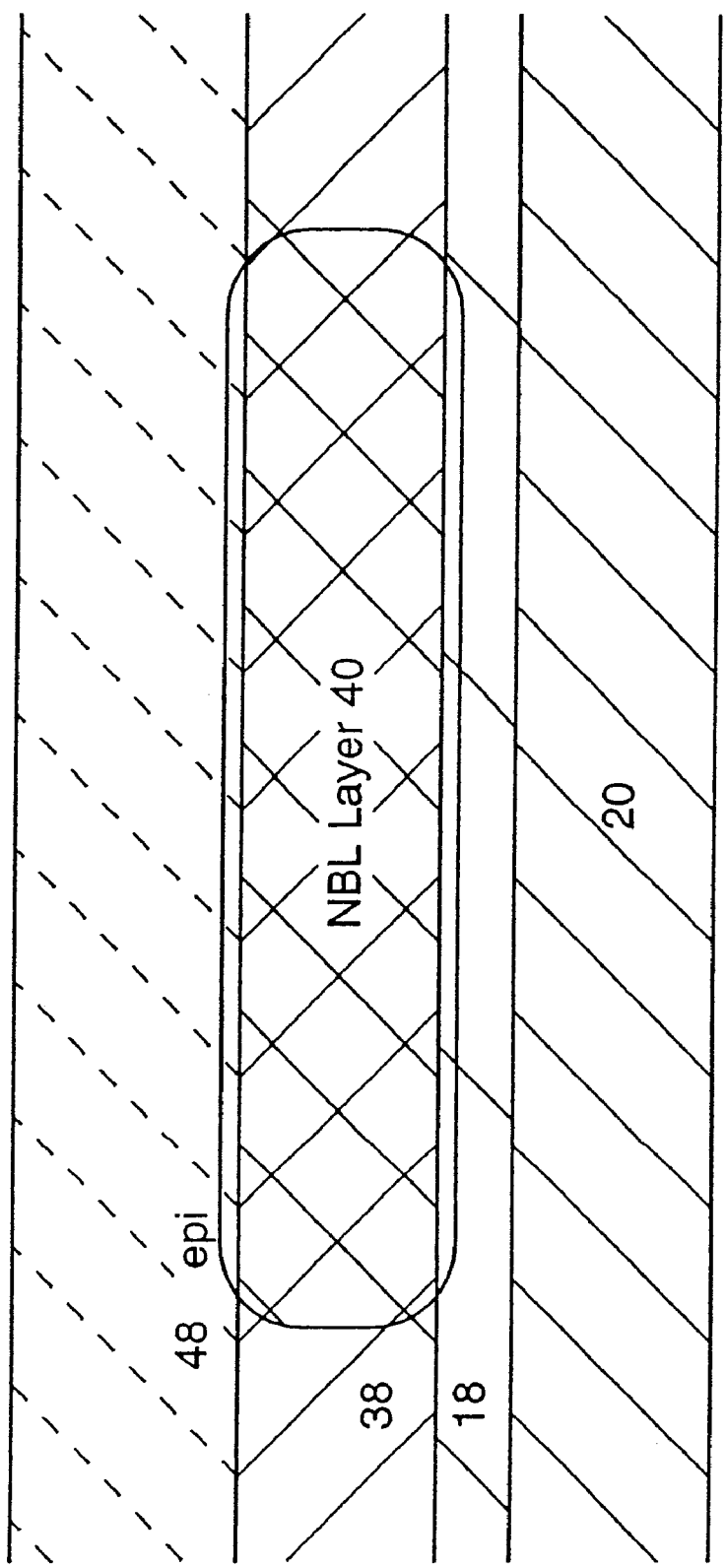

A process for producing the IC inductor 40 shown in FIG. 10 on an SOI base is described with reference to FIGS. 11 to 15. As shown in FIG. 11, the SOI substrate is formed by growing an oxide (SiO2), layer 20, on the surface of an N type silicon wafer, layer 38. The resultant silicon wafer is bonded to another silicon wafer, layer 18, with the SiO2 layer, layer 20, in between the two silicon layers, layers 38 and 18. Then, the original N type wafer, layer 38, is polished down until a thin, approximately 0.5 um, layer remains. This sandwich 18, 20, 38 now forms the SOI substrate. As shown in FIG. 12, an N-type region is formed by masking the substrate and implanting and driving, by thermal diffusion, an N type impurity into layer 38 (The NBL layer, 40, is not needed with the trench grid structure). An N type epitaxial layer, layer 48, is then grown on top of layer 38 and layer 40.

Figure 13:
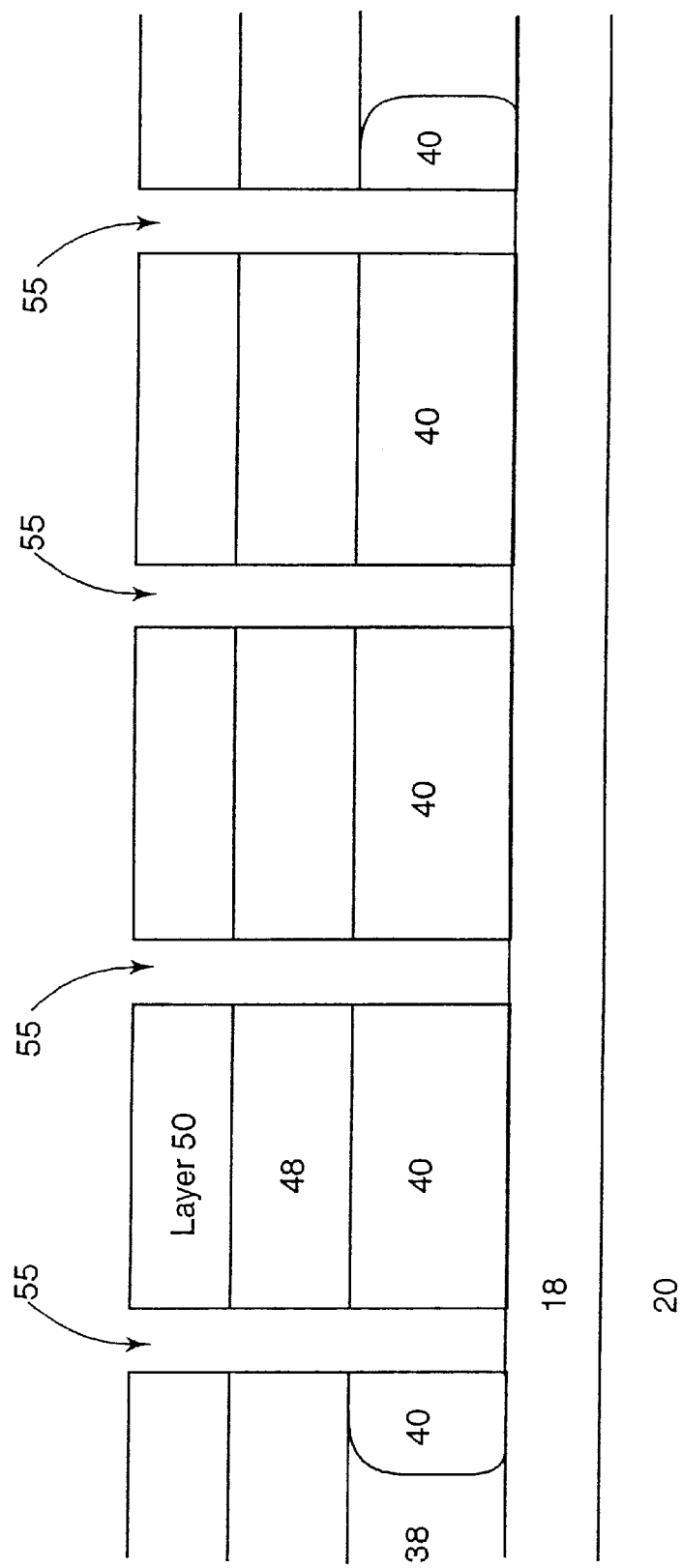

As shown in FIG. 13, an insulation oxide layer, layer 50, is grown on top of layer 48 by means of thermal oxidation.

Figure 14:
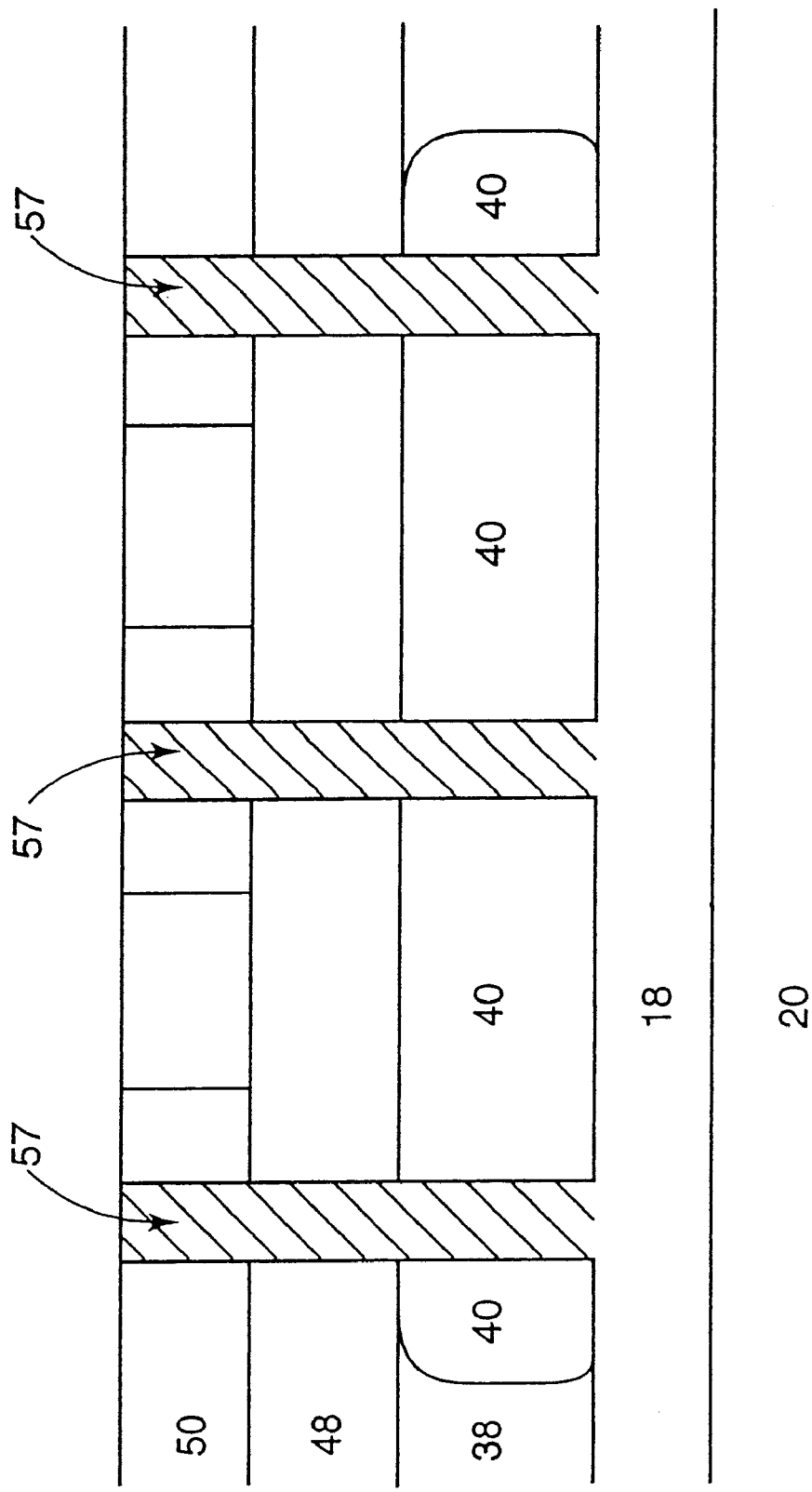
Figure 15:
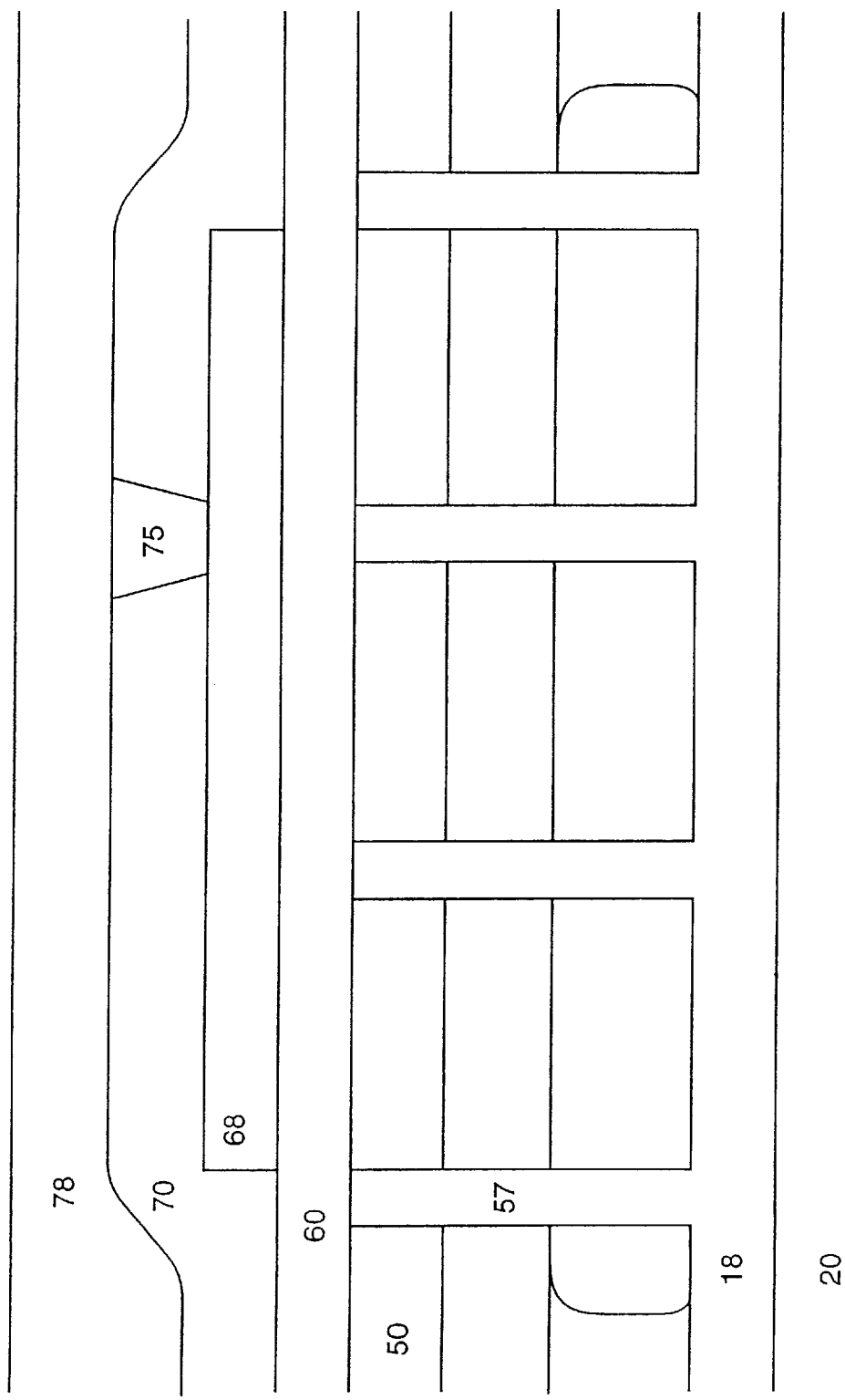

Next, a masking pattern is formed by means of exposing and developing photoresist on top of layer 50. The masking pattern can either be a trench grid or a radial type trench structure, which is used to prevent eddy current formation in the layers 38 and 48. Narrow trenches, 55, are formed by RIE etching through the oxide layer 50 and the silicon layers, layers 48, 38 and 40, down to the insulating oxide layer, layer 18. As shown in FIG. 14, the trenches are filled with CVD oxide, which conformally fills and closes the trenches. The CVD layer is removed from the surface of the wafer but remains in the trenches, 57. The metalization layers that form the inductor 12 can now be fabricated on top of the trench structure. As shown in FIG. 15, an insulating SiO2 layer, layer 60, is deposited on top of layer 50 and layer 57. This is followed by a metalization layer, layer 68, in which the inductor 12 is formed. The metalization layer could be fabricated from Al, AlSi, AlSiCu, Cu, or any suitable conducting material. This could be followed with more layers of insulators, such as layer 70, and additional metal layers, such as layer 78. The metal layers may be connected by means of another layer 75, patterned and etched between the metal layers. Multiple layers of metal can be used to form the inductor in order to reduce the series resistance of the inductor.

It is noted that variations of the above techniques are possible. In particular, the checkerboard pattern 11 may be used in other IC inductor structures that do not employ SOI processing. In addition, an IC inductor structure may be formed using SOI without a checkerboard pattern that performs well provided the substrate has high resistivity. Thus, numerous modifications may be made to the IC inductor configuration described in this specification. Consequently, the invention is not to be limited by the specific illustrated embodiment, but only by the scope of the appended claims.

What is claimed is:

1. An integrated circuit comprising:

a) a substrate;

b) a first dielectric layer contacting the substrate at an interface;

c) a second dielectric layer contacting the first dielectric layer at an interface, the second dielectric layer including a plurality of conducting regions d) a third dielectric layer contacting the second dielectric layer at an interface; and e) an inductor fabricated above the second dielectric layer, f) wherein the plurality of conducting regions induce small eddy currents that do not significantly reduce the inductance of the inductor.

2. The integrated circuit according to claim 1, wherein the substrate is a high resistivity substrate.

3. The integrated circuit according to claim 2, wherein the resistivity of the substrate is about 1 kohm-cm.

4. The integrated circuit according to claim 1, wherein the first dielectric layer consists of silicon oxide.

5. The integrated circuit according to claim 4, wherein the third dielectric layer includes at least one oxide layer.

* * * * *